(12) United States Patent
Tago

(10) Patent No.: US 9,084,365 B2
(45) Date of Patent: Jul. 14, 2015

(54) ELECTRONIC MODULE

(71) Applicant: Murata Manufacturing Co., Ltd., Nagaokakyo (JP)

(72) Inventor: Shigeru Tago, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/562,794

(22) Filed: Dec. 8, 2014

(65) Prior Publication Data

US 2015/0092368 A1 Apr. 2, 2015

Related U.S. Application Data

(63) Continuation of application No. 13/772,483, filed on Feb. 21, 2013, now Pat. No. 8,937,257.

(51) Int. Cl.
| | |
|---|---|
| H05K 1/18 | (2006.01) |
| H05K 1/03 | (2006.01) |
| H05K 1/02 | (2006.01) |
| H05K 1/11 | (2006.01) |

(52) U.S. Cl.
CPC .............. *H05K 1/181* (2013.01); *H05K 1/0298* (2013.01); *H05K 1/0313* (2013.01); *H05K 1/115* (2013.01); *H05K 1/185* (2013.01); *H05K 2201/10537* (2013.01)

(58) Field of Classification Search
CPC ........ H05K 1/115; H05K 1/181; H05K 1/185
See application file for complete search history.

(56) References Cited

PUBLICATIONS

Tago, "Electronic Module", U.S. Appl. No. 13/772,483, Filed Feb. 21, 2013.

*Primary Examiner* — Jeremy C Norris
(74) *Attorney, Agent, or Firm* — Keating & Bennett, LLP

(57) ABSTRACT

An electronic module includes a substrate, a built-in electronic component and a surface mount electronic component. A suckable region is provided on a front surface of the substrate. When viewed in a see-through manner in a direction perpendicular or substantially perpendicular to the front surface of the substrate, the suckable region is inside of a region in which one built-in electronic component is built in and a center of gravity of the electronic module is located inside of the suckable region. A protective layer is not provided on the front surface of the substrate on which the surface mount electronic component is mounted.

6 Claims, 5 Drawing Sheets

ELECTRONIC MODULE

BACKGROUND OF THE INVENTION

1. Field of the Invention

The present invention relates to electronic modules that include a substrate, a built-in electronic component that is built into the inside of the substrate and a surface mount electronic component that is mounted on a front surface of the substrate.

2. Description of the Related Art

To date, electronic modules that include electronic components provided inside and on a front surface of a substrate of the electronic module have been widely used as high-functionality electronic modules.

An example of such an electronic module is disclosed in Japanese Unexamined Patent Application Publication No. 2010-136143. An electronic module 400 of the related art disclosed in Japanese Unexamined Patent Application Publication No. 2010-136143 is illustrated in FIG. 5.

The electronic module 400 includes a substrate 101.

Electronic components 102, 103 and 104 are mounted on a front surface of the substrate 101.

A protective layer 105 composed of a resin is formed on the front surface of the substrate 101 on which the electronic components 102 to 104 are mounted. The front surface of the protective layer 105 is formed so as to be flat so as to be capable of being sucked by the nozzle of a vacuum suction apparatus.

In the electronic module 400, a single-layer substrate is used as the substrate 101, but a multilayer substrate may be used instead. In addition, another electronic component may be built into the inside of the substrate, thereby achieving an increase in the functionality of the electronic module.

A reduction in the size of electronic and electrical devices, as well as a reduction in the size of electronic modules used in such devices is desired. In such size reduction, it is important that the planar area seen in a direction perpendicular to the plane of the device or module be decreased and also that the profile be reduced.

However, in the above-described electronic module 400 of the related art, since the protective layer 105 is formed on the front surface of the substrate 101 on which the electronic components 102 to 104 are mounted, there is a problem in that the profile may not be sufficiently low. As well as protecting the electronic components 102 to 104, the protective layer 105 serves as a layer that can be sucked by the nozzle of a vacuum suction apparatus when the electronic module 400 is to be mounted on the substrate of an electronic or electrical device.

In addition, in the above-described electronic module 400 of the related art, since the electronic components 102 to 104 having different heights and planar areas are built into the inside of the protective layer 105, unevenness may occur on the front surface of the protective layer 105. As a result, when unevenness occurs on the front surface of the protective layer 105, there is a problem in that the protective layer 105 may not be able to be sucked by the nozzle of a vacuum suction apparatus.

SUMMARY OF THE INVENTION

In view of the above-described problems, an electronic module according to a preferred embodiment of the present invention includes a substrate, at least one built-in electronic component that is built into the inside of the substrate, and a plurality of surface mount electronic components that are mounted on a front surface of the substrate. A suckable region, which is a region that can be sucked by a nozzle of a vacuum suction apparatus and in which none of the surface mount electronic components are mounted, is provided on the front surface of the substrate. When viewed in a see-through manner in a direction perpendicular or substantially perpendicular to the front surface of the substrate, the suckable region is inside of a region in which one of the at least one built-in electronic components is built in, and a center of gravity of the electronic module is inside of the suckable region. A protective layer is not provided on the front surface of the substrate on which the surface mount electronic components are mounted.

Since a protective layer is not provided on the substrate on which the surface mount electronic components are mounted, a sufficiently low profile is achieved for the electronic module according to a preferred embodiment of the present invention.

In addition, since the suckable region is provided on the front surface of the substrate, the electronic module can be sucked by a nozzle of a vacuum suction apparatus.

In addition, since one built-in electronic component is built into the substrate directly under the suckable region, the suckable region is very flat.

In addition, since the center of gravity of the electronic module is located within the suckable region, the electronic module can be sucked by the nozzle of the vacuum suction apparatus in a stable state.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, preferred embodiments of the present invention will be described with reference to the drawings.

First Preferred Embodiment

Figure 1:
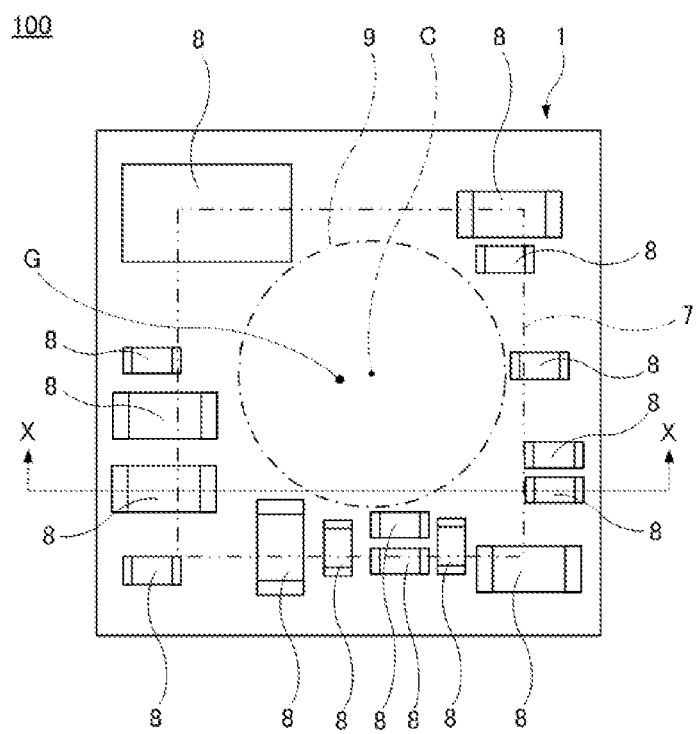
FIG. 1 is a plan view illustrating an electronic module according to a first preferred embodiment of the present invention.
Figure 2:
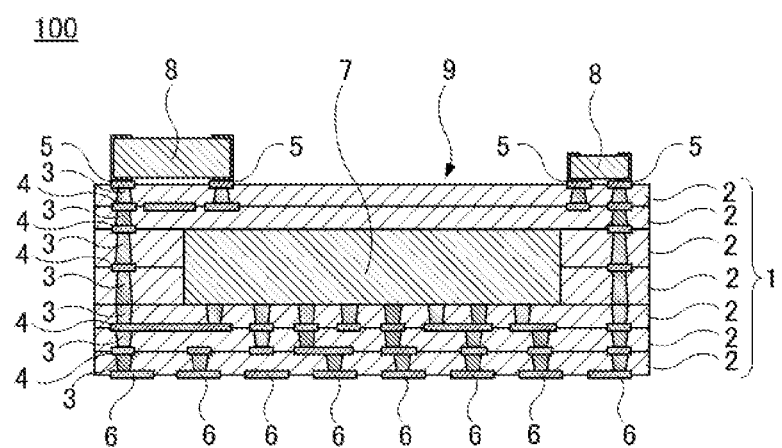
FIG. 2 is a sectional view of the electronic module according to the first preferred embodiment of the present invention taken along the broken line X-X in FIG. 1.

An electronic module 100 according to a first preferred embodiment of the present invention is illustrated in FIG. 1 and FIG. 2. FIG. 1 is a plan view of the electronic module 100. FIG. 2 is a sectional view of the electronic module 100 taken along a broken line X-X in FIG. 1.

The electronic module 100 includes a substrate 1. The substrate 1 includes inside thereof internal wiring.

In this preferred embodiment, the substrate 1 preferably is a multilayer substrate including a plurality of resin layers 2 stacked on top of one another.

Via holes 3 are arranged in the resin layers 2 so as to penetrate between front and back main surfaces of the resin layers 2. In addition, wiring patterns 4, 5 and 6 may be provided on at least one of the front surfaces and the back surfaces of the resin layers 2. The wiring patterns 5 provided on the front surface of the resin layer 2 stacked as the uppermost layer of the substrate 1 may define and function as land electrodes used to mount surface mount electronic components 8, which will be described later. In addition, the wiring patterns 6 provided on the back surface of the resin layer 2 stacked as the lowermost layer of the substrate 1 may define and function as mount electrodes used to mount the electronic module 100 on, for example, the substrate of an electronic or electrical device.

A cavity is provided in at least one of the resin layers 2 stacked in the middle of the substrate 1, so as to penetrate between the front and back surfaces of the at least one resin layer. A built-in electronic component 7 is built into the inside of the cavity. In FIG. 1, the built-in electronic component 7 is built into the inside of the substrate 1 and cannot be seen, and therefore the position at which the built-in electronic component 7 is built in is indicated by a two-dot chain line. In addition, in this preferred embodiment, the cavity is preferably provided in two of the resin layers 2 stacked in the middle of the substrate 1 and the built-in electronic component 7 is built into the entirety of this cavity and therefore in FIG. 2 the cavity is not illustrated.

In this preferred embodiment, a single semiconductor component, which includes a plurality of terminal electrodes (not illustrated) provided on a bottom surface thereof, is adopted as the built-in electronic component 7. In addition, in this preferred embodiment, as is clear from FIG. 2, the built-in electronic component 7 is built in so as to be closer to the front surface side of the substrate 1 than to the back surface side.

In preferred embodiments of the present invention, the number of built-in electronic components 7 is arbitrary and is not limited to one as described in this preferred embodiment. However, as will be described later, it is necessary that a single built-in electronic component 7 having a large planar area be built in directly below a suckable region 9 inside the substrate 1.

Inside the substrate 1, the via holes 3 and the wiring patterns 4, 5 and 6 are connected to one another, or via holes 3 are connected to each other so as to define internal wiring constituting a desired circuit. Terminal electrodes of the built-in electronic component 7 are also connected to the substrate internal wiring.

A plurality of surface mount electronic components 8 are mounted on the front surface of the substrate 1. Specifically, terminal electrodes are provided on the individual surface mount electronic components 8. Then, the terminal electrodes of the surface mount electronic components 8 are soldered to the wiring patterns 5. The surface mount electronic components 8 are not limited to being a single type of electronic component and a variety of electronic components having different functions, shapes and sizes are preferably provided.

As indicated by the single-dot chain line in FIG. 1, the suckable region 9 is provided on the front surface of the substrate 1. The suckable region 9 is a region in which the surface mount electronic components 8 are not mounted and which can be sucked by a nozzle of a vacuum suction apparatus when mounting the electronic module 100 on the substrate of an electrical or electronic device. In this preferred embodiment, the suckable region 9 preferably is circular or substantially circular with a center point C and has a radius of about 0.75 mm or more, for example.

In the electronic module 100, as illustrated in FIG. 1, the suckable region 9 is located inside a region in which the built-in electronic component 7 is built in, when viewed in a see-through manner in a direction perpendicular or substantially perpendicular to the front surface of the substrate 1. In addition, a center of gravity G of the electronic module 100 is located within the suckable region 9. The center of gravity G of the electronic module 100 can be obtained using a finite element method, for example.

In the electronic module 100 according to the first preferred embodiment having the above-described structure, a protective layer is not provided on the substrate 1 on which surface mount electronic components 8 have been mounted and therefore a sufficiently low profile is achieved. In addition, in the electronic module 100, since the suckable region 9, which has an area that is sufficiently wide to be sucked by a nozzle of a vacuum suction apparatus, is provided on the front surface of the substrate 1, the electronic module 100 can be sucked by the nozzle of a vacuum suction apparatus. In addition, in the electronic module 100, since a single built-in electronic component 7 is built into the inside of the substrate 1 directly below the suckable region 9, the suckable region 9 is very flat. Moreover, since the center of gravity G of the electronic module 100 lies within the suckable region 9, the electronic module 100 can be sucked by the nozzle of the vacuum suction apparatus in a stable state.

It is preferable that the suckable region 9 of the electronic module 100 have a circular or substantially circular shape with a radius of about 0.75 mm or more or a shape that encompasses a circle with a radius of about 0.75 mm or more, for example. That is, the nozzles of vacuum suction apparatuses currently in use often have a circular shape with a radius of about 0.75 mm, 1.0 mm, 1.75 mm or 2.0 mm, for example. Thus, if the suckable region 9 has a circular or substantially circular shape with a radius of about 0.75 mm or more or a shape that encompasses a circle with a radius of about 0.75 mm or more, for example, the electronic module 100 can be sucked by any of such nozzles.

In addition, it is desirable that the built-in electronic component 7 of the electronic module 100 be built into the substrate 1 so as to be closer to the front surface side of the substrate 1 than to the back surface side. This is because the flatness of the suckable region 9 on the front surface of the substrate 1 can be improved by arranging the built-in electronic component 7 so as to be closer to the front surface of the substrate 1.

Next, an example of a method of manufacturing the electronic module 100 according to the first preferred embodiment will be described.

First, a mother resin sheet for forming the resin layers 2 of the substrate 1 is prepared. The mother resin sheet is a sheet for forming multiple resin layers 2. The mother resin sheet is, for example, formed of a thermoplastic resin. Such mother resin sheets need not have a single thickness, and sheets having a plurality of thicknesses may be prepared as needed. A metal foil such as copper foil for forming the wiring patterns 4, 5 and 6 is applied in advance to at least one of the front surface and the back surface of the mother resin sheet.

Next, portions of the metal foil applied to the mother resin sheet are removed by etching so as to form the wiring patterns 4, 5 and 6 having desired shapes.

Next, holes for forming the via holes 3 are formed in the mother resin sheet. The holes are for example formed by radiation of laser light. In addition, a cavity is formed in the mother resin sheet. The cavity is, for example, formed by punching with a die.

Next, the insides of the holes formed in the mother resin sheet are filled with a conductive paste so that the via holes 3 are completed.

Next, the mother resin sheet is cut into a plurality of pieces such that the individual resin layers 2 are completed.

Next, the built-in electronic component 7 is prepared.

Then, the built-in electronic component 7 is mounted on a specific resin layer 2. At this time, terminal electrodes located on the bottom surface of the built-in electronic component 7 are connected to the via holes 3 or the wiring patterns 4 located in or on that specific resin layer 2.

Next, the plurality of resin layers 2 are stacked on top of one another and thermally press bonded so as to form the substrate 1. At this time, the built-in electronic component 7 mounted on the specific resin layer 2 is accommodated inside the cavity formed in adjacent resin layers 2.

Next, the surface mount electronic components 8 are prepared. For example, capacitors, inductors and resistors are preferably used as the surface mount electronic components 8, for example.

Then, the surface mount electronic components 8 are mounted on the wiring patterns 5 located on the front surface of the substrate 1 so as to complete manufacture of the electronic module 100. The mounting is performed by, for example, reflow soldering.

Examples of the structure and a method of manufacturing the electronic module 100 according to the first preferred embodiment of the present invention have been described above. However, the present invention is not limited to the above-described content and can be modified in various ways within the gist of the present invention.

For example, in the electronic module 100, the suckable region 9 provided on the front surface of the substrate 1 preferably has a circular or substantially circular shape with a radius of about 0.75 mm or more, but the shape and the size of the suckable region 9 may be appropriately chosen and can be modified in various ways in accordance with the shape and size of the nozzle of the vacuum suction apparatus that is to be used.

In addition, the number, type, shape, size and so forth of the built-in electronic component 7 and the surface mount electronic component 8 may be appropriately chosen and are not limited to those described above.

Second Preferred Embodiment

Figure 3:
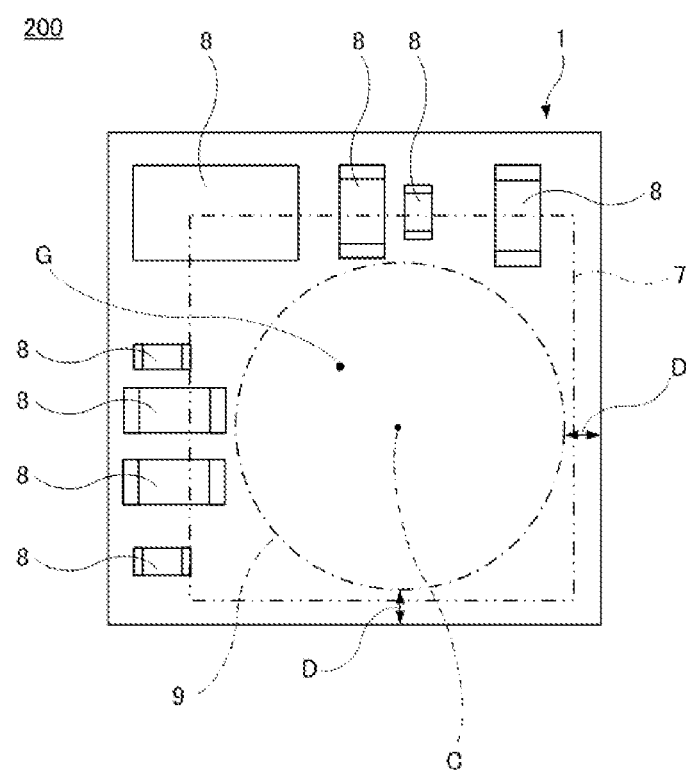
FIG. 3 is a plan view illustrating an electronic module according to a second preferred embodiment of the present invention.

An electronic module 200 according to a second preferred embodiment of the present invention is illustrated in FIG. 3. FIG. 3 is a plan view of the electronic module 200.

In the electronic module 200, a plurality of surface mount electronic components 8 are arranged and mounted in an L shape on the front surface of the substrate 1. The suckable region 9 is provided in a space between the surface mount electronic components 8 and the two remaining sides of the substrate 1 along which the surface mount electronic components 8 are not mounted.

In the electronic module 200, the suckable region 9 is arranged so as to be located at approximately a distance D from the sides of the substrate 1 along which surface mount electronic components 8 are not mounted. This is because, if the suckable region 9 were arranged so as to be flush with these sides of the substrate 1, there would be a risk of the nozzle becoming separated from the front surface of the substrate 1 and an occurrence of suction failure when the electronic module 200 is sucked by the nozzle of a vacuum suction apparatus.

Third Preferred Embodiment

Figure 4:
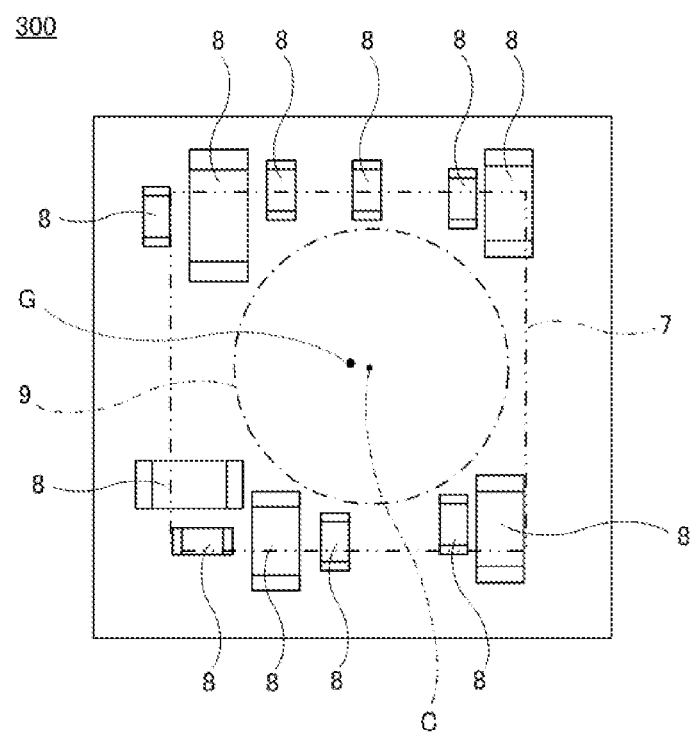
FIG. 4 is a plan view illustrating an electronic module according to a third preferred embodiment of the present invention.
Figure 5:
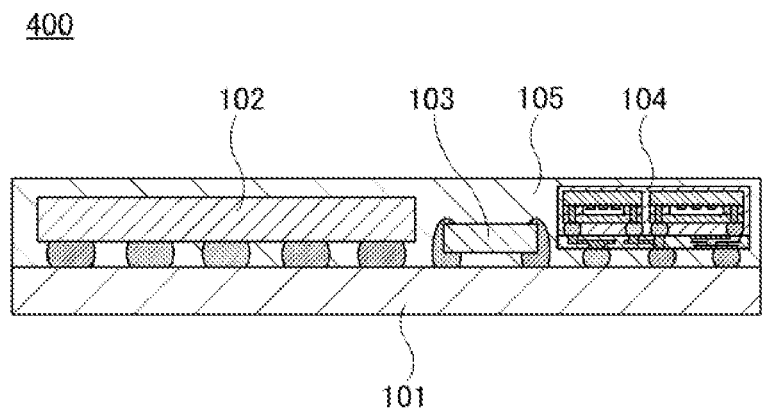
FIG. 5 is a sectional view illustrating an electronic module of the related art.

An electronic module 300 according to a third preferred embodiment of the present invention is illustrated in FIG. 4. FIG. 4 is a plan view of the electronic module 300.

In the electronic module 300, a plurality of surface mount electronic components 8 are arranged and mounted along two opposing sides of the substrate 1. The suckable region 9 is provided between the surface mount electronic components 8.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic module comprising:
   a substrate;
   at least one built-in electronic component that is built into an inside of the substrate; and
   a plurality of surface mount electronic components that are mounted on a front surface of the substrate; wherein
   a suckable region, which is a region that can be sucked by a nozzle of a vacuum suction apparatus and within which none of the surface mount electronic components are mounted, is provided on the front surface of the substrate;
   when viewed in a see-through manner in a direction perpendicular or substantially perpendicular to the front surface of the substrate, the suckable region is located inside of a region in which one of the at least one built-in electronic components is built in and a center of gravity of the electronic module is located inside of the suckable region; and
   when viewed in a see-through manner in a direction parallel or substantially parallel to the front surface of the substrate, one of the at least one built-in electronic components is built into the substrate so as to be closer to the front surface of the substrate on which the surface mount electronic components are mounted than to a back surface of the substrate.

2. The electronic module according to claim 1, wherein the suckable region is circular or substantially circular and has a radius of about 0.75 mm or more.

3. The electronic module according to claim 1, wherein the suckable region has a shape that encompasses a circle having a radius of about 0.75 mm or more.

4. The electronic module according to claim 1, wherein the substrate is a multilayer substrate.

5. The electronic module according to claim 2, wherein the substrate is a multilayer substrate.

6. The electronic module according to claim 3, wherein the substrate is a multilayer substrate.

* * * * *